(12) United States Patent
Dubs et al.

(10) Patent No.: US 6,899,795 B1
(45) Date of Patent: May 31, 2005

(54) SPUTTER CHAMBER AS WELL AS VACUUM TRANSPORT CHAMBER AND VACUUM HANDLING APPARATUS WITH SUCH CHAMBERS

(75) Inventors: Martin Dubs, Maienfeld (CH); Roman Schertler, Wolfurt (AT)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 09/484,421

(22) Filed: Jan. 18, 2000

(51) Int. Cl.$^7$ .............................................. C23C 14/34
(52) U.S. Cl. ........................... 204/192.12; 204/298.16; 204/298.23
(58) Field of Search ...................... 204/192.12, 298.12, 204/298.13, 298.16, 298.18, 298.23, 298.25

(56) References Cited

U.S. PATENT DOCUMENTS

| | | | |
|---|---|---|---|
| 4,756,810 A | * 7/1988 | Lamont, Jr. et al. | .... 204/192.15 |
| 4,853,102 A | * 8/1989 | Tateshi et al. | ......... 204/298.25 |
| 5,288,379 A | * 2/1994 | Namiki et al. | ......... 204/298.25 |
| 5,415,729 A | 5/1995 | Strasser et al. | |
| 5,626,727 A | * 5/1997 | Yamanishi et al. | .... 204/298.18 |
| 5,820,682 A | * 10/1998 | Sung et al. | .................. 118/726 |
| 5,855,681 A | * 1/1999 | Maydan et al. | ........ 204/298.25 |
| 6,051,113 A | * 4/2000 | Moslehi | ................. 204/192.12 |

FOREIGN PATENT DOCUMENTS

| | | |
|---|---|---|
| DE | 4104592 | 8/1992 |
| EP | 0273550 | 7/1988 |
| EP | 0312694 | 12/1989 |
| EP | 0449227 | 10/1991 |
| JP | 60131967 | 7/1985 |
| JP | 60238133 | 11/1985 |
| JP | 2141568 | 5/1990 |
| JP | 10121237 | 5/1998 |
| JP | 10 147 864 A | * 6/1998 |

OTHER PUBLICATIONS

R. H. Horng, et al. "Effects of rapid thermal process on structural and electrical characteristics of $Y_2O_3$ thin films by r.f.–magnetron sputtering" Thin Solid Films, 1996.
Copy of Search Report.

* cited by examiner

*Primary Examiner*—Gregg Cantelmo
(74) *Attorney, Agent, or Firm*—Crowell & Moring LLP

(57) ABSTRACT

A sputtering chamber system and method uses at least one sputtering source with a new sputter surface at least approximately symmetrical with respect to a central axis. A substrate carrier is arranged to be drivingly rotatable about a substrate carrier axis. The central axis and the substrate carrier axis are oblique with respect to one another, and the sputtering source is a magnetron sputtering source. The new sputter surface is substantially rotationally symmetrical with respect to the central axis, with the central axis and the substrate carrier axis intersecting at least approximately. With respect to an angle β between the central axis and the substrate carrier axis, $$30° \leq \beta \leq 60°,$$

preferably $$40° \leq \beta \leq 55°,$$

particularly preferably $$43° \leq \beta \leq 50°,$$

particularly $$\beta \approx 45°.$$

11 Claims, 8 Drawing Sheets

SPUTTER CHAMBER AS WELL AS VACUUM TRANSPORT CHAMBER AND VACUUM HANDLING APPARATUS WITH SUCH CHAMBERS

BACKGROUND OF THE INVENTION

The present invention relates to a sputtering chamber having at least one sputtering source with a new sputter surface at least approximately symmetrical with respect to a central axis and a substrate carrier which is rotatable in a driven manner about a substrate carrier axis. The central axis and the substrate carrier axis are oblique with respect to one another.

Furthermore, the present invention relates to a vacuum treatment system having the above-mentioned sputtering chamber, a vacuum transport chamber for disk-shaped workpieces, and finally a vacuum treatment system having a vacuum transport chamber.

U.S. Pat. Nos. 4,818,561 and 4,664,935 describe conventional sputtering chambers. The central axis of the sputtering source is arranged at an oblique angle with respect to an axis of rotation of a substrate carrier. The substrate carrier is rotated in a driven manner about the substrate carrier axis. With this sputtering chamber, coating uniformities of better than ±4% are achieved on wafers, whose diameters may be up to 200 mm.

During the manufacturing of storage disks, particularly of optical storage disks, such as mini floppy disks or CDs; further, during the manufacturing of masters, but also for the manufacturing of piezoelectric wafers, of wafers for the production of semiconductors, in this case, particularly also for wafers for the implementation of SAW's (Surface Acoustic Waves), it is extremely important to reach a uniform layer thickness distribution which is at least equally good as, if not better than, that which can be achieved with the known sputtering chambers. In addition, the coating rates should be as high as possible in order to achieve coating times which are as short as possible and thus production rates which are as high as possible.

SUMMARY OF THE INVENTION

It is an object of the invention to suggest a sputtering chamber of the initially mentioned type by means of which, while the coating rates are increased, layer thickness homogeneities can be achieved which are even better than those achievable by means of the known sputtering chambers.

This object has been achieved, according to the present invention, by providing an improved sputtering chamber, specifically one in which the sputtering source is a magnetron sputtering source.

While, in a conventional sputtering source, the sputtering surface of the target is removed essentially uniformly, the situation is completely different with magnetron sputtering sources. Because of the tunnel-shaped magnetic field which is inherent to the magnetron sputtering sources, is built up over the sputtering surface of the target and is closed in itself, a surrounding erosion trough is formed on the sputtering surface. The erosion trough, as the sputtering-off time increases, varies the direction characteristic of the sputtered-off target material. If several tunnel fields are provided, surrounding erosion troughs may be formed.

Although magnetron sputtering sources result in higher sputtering-off rates and thus also higher coating rates than conventional sputtering sources, they are much more critical with respect to the achievable uniformity of the layer thicknesses. It is therefore even more astonishing that with the use according to the invention of a magnetron sputtering source at the sputtering chamber according to the invention, not only a higher coating rate can be achieved and thus shorter coating times, but also coating thickness uniformities are achieved which are at least as good as and even significantly better than those achievable with conventional sputtering chambers.

It is another object of the present invention to integrate the above-mentioned sputtering chamber according to the invention into a vacuum treatment system such that, in an automated manner, the fast coating times, which can be achieved by the sputtering chamber according to the invention, can also be utilized to their full extent. This is achieved by a vacuum treatment system in which the above-mentioned sputtering chamber is connected by way of one or several transport chambers with at least one lock chamber, at which substrates are transferred inward from the surroundings into the vacuum or are transferred outward from the vacuum into the surroundings.

Furthermore, a vacuum transport chamber is suggested which is conceived particularly for short transport cycles, which is inventive per se and which can be ideally combined with the sputtering chamber according to the invention to form a vacuum treatment system with extremely short transport cycles and, in addition, particularly in preferred embodiments of the transport chamber according to the invention, leads to extremely short inward-transfer and outward-transfer cycles of substrates to be coated and coated substrates.

The sputtering chamber and the transport chamber according to the invention as well as the systems according to the invention are suitable particularly for the coating of optical data storage substrates as well as masters for the manufacturing of such optical data storage disks or of piezoelectric wafers or wafers for the production of semiconductors.

BRIEF DESCRIPTION OF THE DRAWINGS

Other objects, advantages and novel features of the present invention will become apparent from the following detailed description of the invention when considered in conjunction with the accompanying drawings.

DETAILED DESCRIPTION OF THE DRAWINGS

Figure 1:
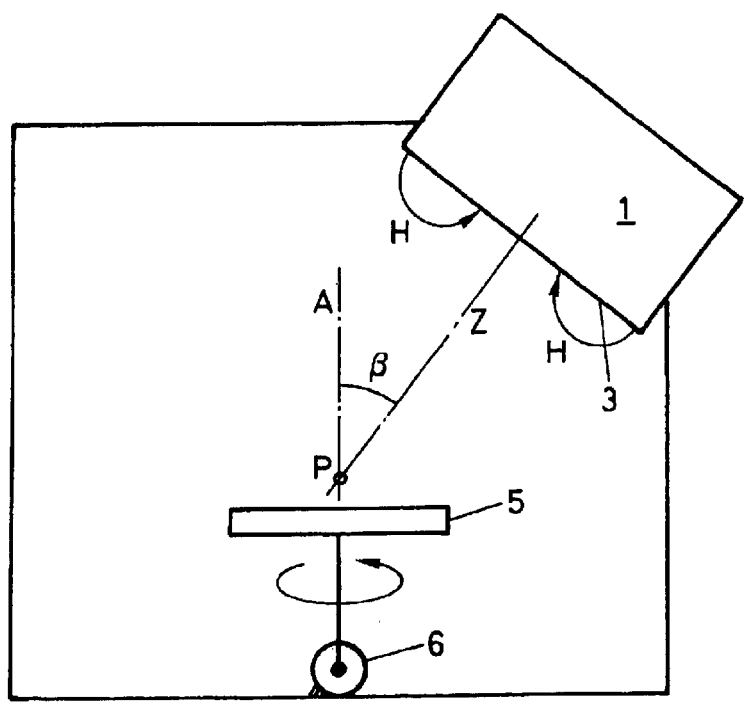
FIG. 1 is a schematic view of a sputtering chamber according to the invention.

FIG. 1 shows a sputtering chamber having a magnetron sputtering source 1. The tunnel-shaped magnetron magnetic field H which is closed in itself and extends around the central axis Z of the source 1 is schematically illustrated above the sputtering surface 3 of a target arrangement of the magnetron sputtering source 1. In the top view, that is, viewed in the direction of the central axis Z, the sputtering surface 3 of the magnetron source 1 may have a rectangular, square, elliptical design etc., but is preferably rotationally symmetrical with respect to the central axis Z. However, the central axis Z is definitely situated in a plane of symmetry of the sputtering surface 3 viewed in the top view. Furthermore, the sputtering surface, in its new condition, called a new sputter surface, may at least essentially be planar or define a concave surface. A single tunnel-shaped magnetic field H may be provided which is closed in itself and extends around the central axis Z, or two or more fields may be provided.

In addition, the one or several provided magnetron fields H, which are closed in themselves and extend around the central axis Z, may be constructed in a steady-state manner or in a varying manner with respect to time, as, for example, by providing moving magnet arrangements below the target arrangement with permanent magnets and/or solenoids or, generated by solenoids which are selectively triggered with respect to time.

Figure 2A:
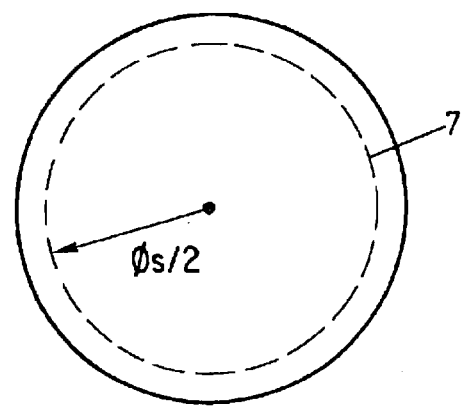
FIGS. 2a and 2b are top views of a substrate carrier arrangement, as provided on the sputtering chamber of FIG. 1 according to the invention, for defining the relationships with respect to substrates deposited thereon.
Figure 2B:
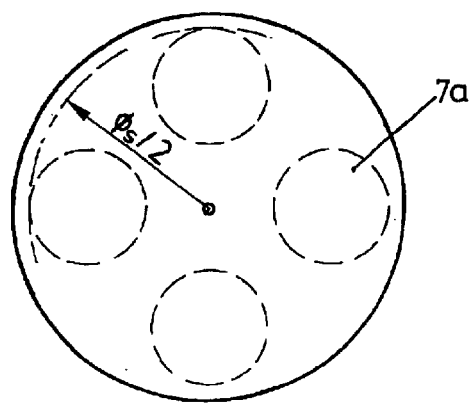

With reference to FIG. 1, the sputtering chamber according to the invention has a substrate carrier 5 which, in a driven manner 6 is rotationally movable about a substrate carrier axis A. The substrate carrier 5 is constructed such that it can accommodate an individual substrate 7 (FIG. 2a), preferably centered with respect to the substrate carrier axis A, or it can accommodate several substrates 7a, preferably also in a centered manner, (FIG. 2b). In this case, the one substrate 7 or also the several substrates 7a can definitely overlap the substrate carrier 5, as illustrated in FIGS. 2a and 2b at 7' and 7a'.

In the following description, the diameter $\phi_S$ indicates either the substrate diameter according to FIG. 2a, or the diameter of the outer substrate boundary line according to FIG. 2b.

On the sputtering chamber according to the invention, differently shaped substrates, like square or rectangular substrates, can definitely also be sputter-coated.

The magnetron sputtering process can take place in a reactive or non-reactive manner, and the magnetron sputtering source DC, DC+AC, can be operated with pulsed DC or with pure AC, in which case AC can be chosen up into the HF-range.

The central axis Z and the substrate carrier axis A are oblique with respect to one another. They do not necessarily intersect one another.

For this reason, in the following only a—partially preferred—special case of the "intersection point" of both axes Z, A is addressed; more generally, the "site of the smallest spacing" of the two axes is mentioned.

When the angle β is addressed which the axes Z and A take up with respect to one another, in the case of inclined axes, this angle is determined in that one axis is displaced in parallel until both axes are situated in a plane. This results in the angle β in this plane.

However, in a preferred embodiment, as shown in FIG. 1 at point P, the central axis Z of the source 1 and the substrate carrier axis A intersect at least almost.

Irrespective of whether the two mentioned axes Z and A intersect or are inclined with respect to one another, they definitely preferably enclose an angle β, to which the following applies:

$$30° \leq \beta \leq 60°,$$

preferably $$40° \leq \beta \leq 55°,$$

particularly preferably $$43° \leq \beta \leq 50°,$$

in this case, extremely preferably an angle $\beta \approx 45°$.

When this angle β is precisely maintained, the uniformity of the thickness of the deposited layer is optimized.

Figure 3:
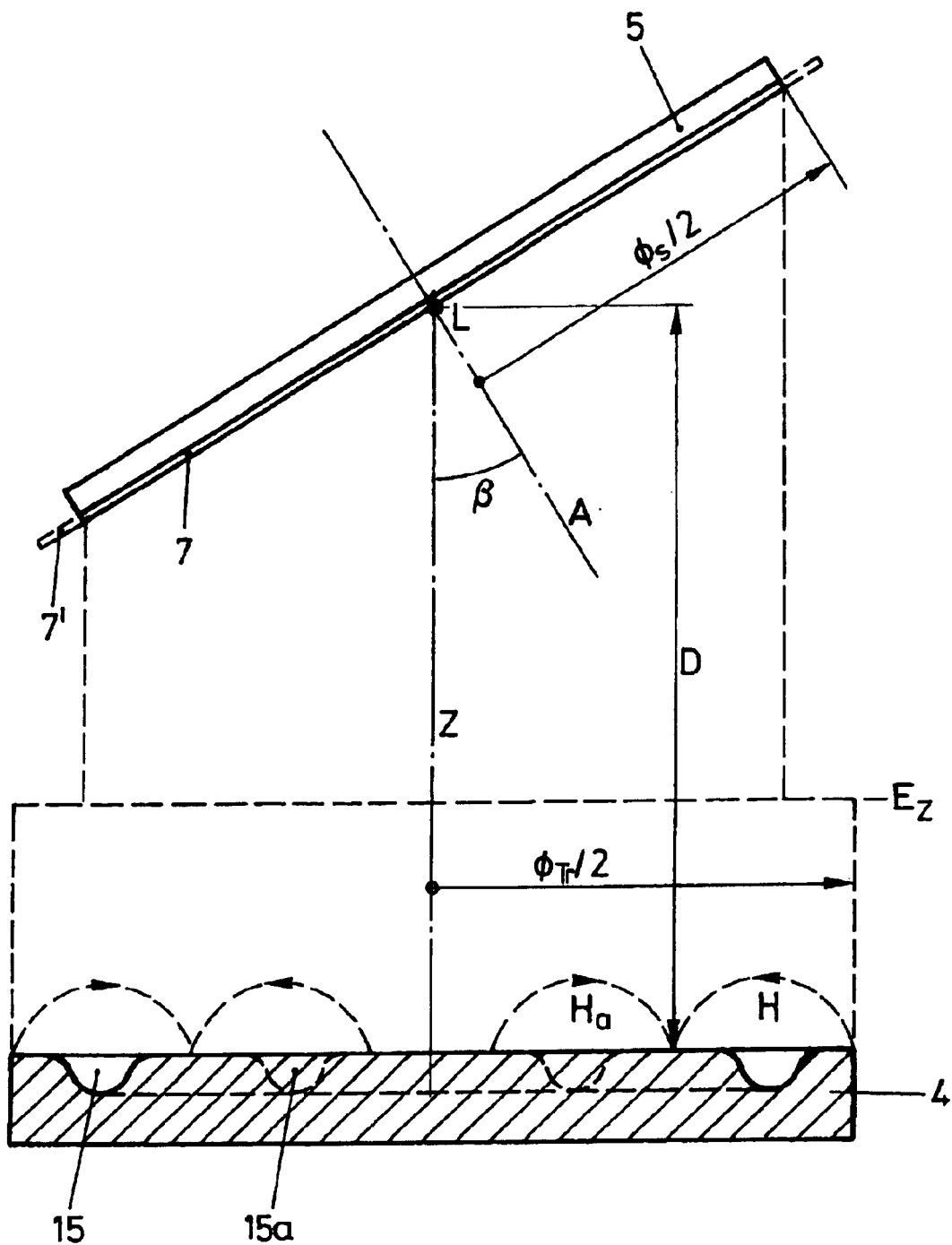
FIG. 3 is a schematic view of the arrangement of the substrate carrier and the magnetron sputtering target on a sputtering chamber according to the invention for defining the mutual geometrical position relationships.

As schematically illustrated In FIG. 3, the site L of the shortest distance between the central axis Z and the substrate carrier axis A is preferably situated at least approximately on the center of the substrate carrier 5, in this case, preferably on the surface to be coated of a centered substrate 7, 7'.

The sputtering source according to the invention can be arranged in the space in an arbitrarily oriented manner.

As further illustrated in FIG. 3, the projection of the substrate surface onto a plane $E_Z$ perpendicular to the central axis Z is preferably smaller than the projection of the new sputter surface onto this plane $E_Z$.

FIG. 3 qualitatively shows the erosion trough 15 which forms during the operation on the sputtering surface and extends around the central axis Z, or a second erosion trough 15a, when two surrounding tunnel-shaped magnetic fields, which are closed in themselves, are implemented.

With respect to the central axis Z, $r_{Tr}$ indicates the radius of the site of the largest erosion depth of the radially outermost erosion trough 15.

In a preferred embodiment of the sputtering chamber according to the invention, the following ratio is obtained between this radius $r_{TR}$ and the distance D between the new sputter surface and the site L or between the new sputter surface and the substrate carrier 5

$$¼ \leq r_{Tr}/D \leq ⅔.$$

Furthermore, the following preferably applies according to FIG. 3 to the diameter $\phi_T$ of the projection of a rotationally symmetrical new sputter surface onto the plane $E_z$ and the mentioned distance D $$¾ \leq \Phi_T/D \leq 2,$$

in this case, particularly the following applies $$\Phi_T \approx 1.2D.$$

With respect to the diameter $\phi_S$ (see definition above), with respect to the above-mentioned distance D, the following preferably applies $$\Phi_S/D \leq 1.8.$$

Furthermore, the following preferably applies in a preferred embodiment with respect to the above-mentioned diameter $\phi_S$ and the above-mentioned sputtering surface diameter or sputtering surface projection diameter $\phi_T$ $$0.5 \leq \Phi_S/\Phi_T \leq 2.4.$$

preferably $$1 \leq \Phi_S/\Phi_T \leq 2.4.$$

Particularly in the case of axes Z and A which, as illustrated in FIG. 3, intersect at least approximately, the indicated dimensioning rules result in an optimal utilization of the material sputtered off the target 4 with respect to the material placed on the substrate or substrates, specifically of at least 10%. In this case, layer thickness deviations along the coated substrate surfaces of no more than ±1% are reachable without, particularly on a plane round target, special measures having to be taken with respect to the formation of the erosion troughs.

In addition, the above-mentioned dimensioning rules lead to the following advantages: minimal sensitivity of the resulting uniformity of the layer thicknesses to variations of D and thus also to the increasing erosion of the target in the course of its service life; minimal sensitivity of the uniformity of the layer thicknesses to changes of the erosion profile or profiles; and minimal sensitivity of the uniformity of the layer thicknesses to positioning errors of the substrate or substrates on the substrate carrier 5.

In a particularly preferred embodiment the following applies:

$$50 \text{ mm} \leq \Phi_S \leq 400 \text{ mm},$$

in this case, preferably $$50 \text{ mm} \leq \Phi_S \leq 300 \text{ mm},$$

particularly preferably and particularly used for individual substrates in a centered manner with respect to the substrate carrier axis A, diameter $\Phi_S$ of 64 mm (particularly for mini floppy disks), 120 mm (particularly for CDs), 160 to 240 mm (for CD masters). For the highly precise depositing of layers on piezoelectric wafers, the substrate holding device is preferably sized for substrate diameters of at least 75 mm; for the treatment of wafers for the semiconductor production for the receiving of wafers, it is sized with diameters of between 150 and 300 mm.

Figure 4:
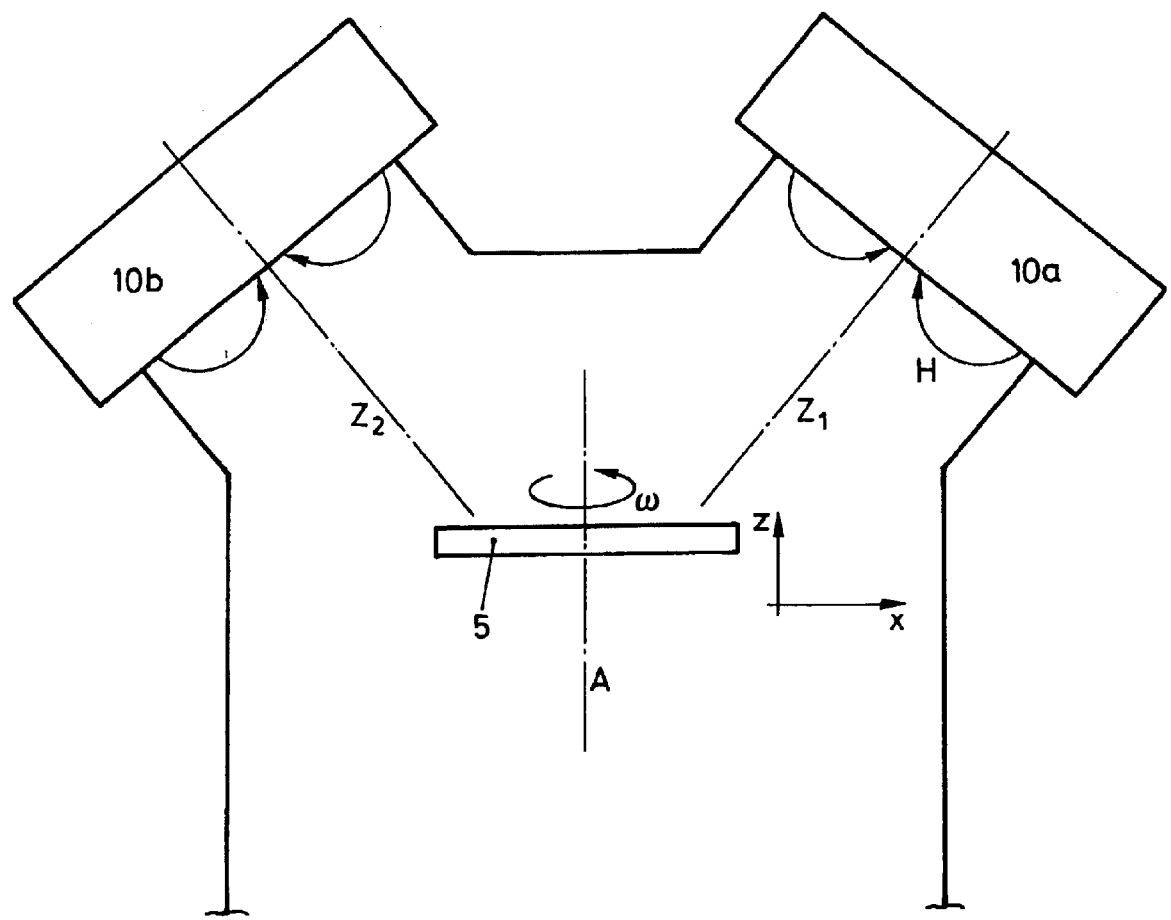
FIG. 4 is a representation similar to FIG. 1 of a sputtering chamber according to the invention but having a double magnetron source.

As schematically illustrated in FIG. 4, two or more sources 10a, 10b, of which at least one is a magnetron source, may act simultaneously or alternately on the same substrate carrier 5 or the substrates placed thereon. As a result, it becomes possible to deposit, for example, alloys while maintaining the initially mentioned requirements or other compounds while including the possibility of also sputtering reactively. Precise positioning of the substrate carrier 5 in the Z- and X-direction allows for adjustment of source-specific coating characteristics.

Figure 5:
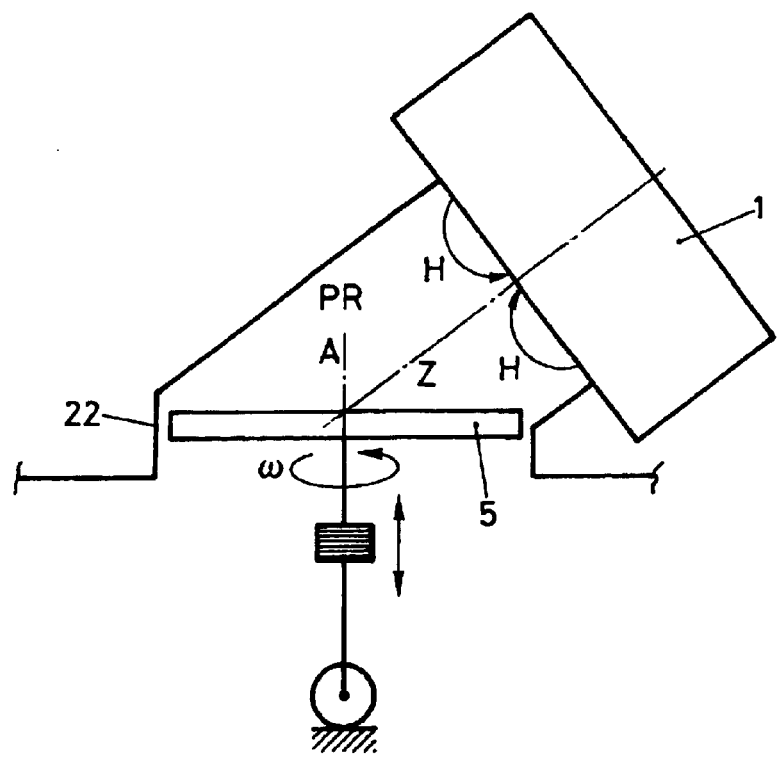
FIG. 5 is a schematic view of another currently preferred embodiment of the sputtering chamber according to the invention, in which a process space is partitioned off.

FIG. 5 schematically shows another preferred embodiment of the sputtering source according to the invention. The magnetron source 1 and the substrate carrier 5 or substrates deposited thereon, in the machining position, close off a process space PR in that the substrate carrier 5 or a substrate itself are placed so far against side walls 22 of the vacuum chamber that the free rotating movement 4 is still ensured. For this purpose, as illustrated in FIG. 5, the substrate carrier can not only be driven to carry out the mentioned rotating movement ω but can preferably also be lifted linearly into the machining position and be lowered from it. By the uncoupling of the process space P from other chamber parts, particularly with movable parts, the particle contamination is reduced during the coating.

Figure 6:
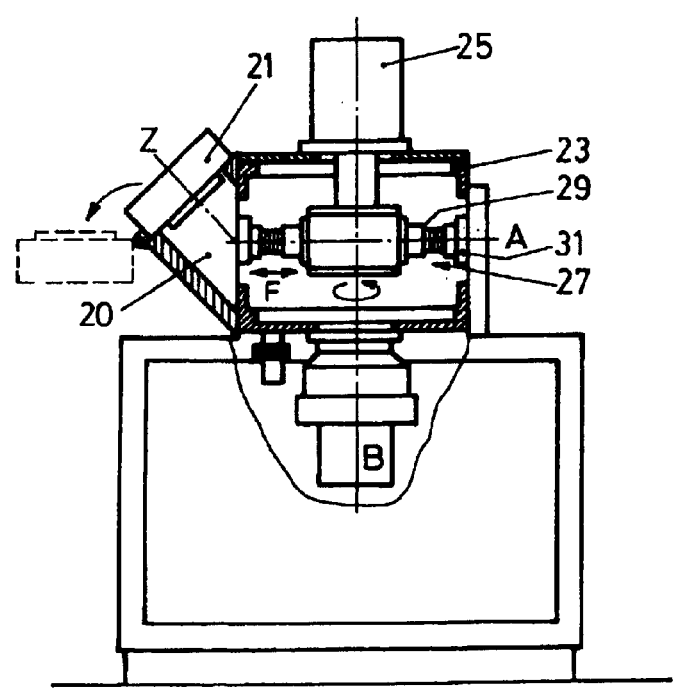
FIG. 6 is a schematic side view of a vacuum treatment system according to the invention with a sputtering chamber according to the invention, shown in partial cross-section.
Figure 10:
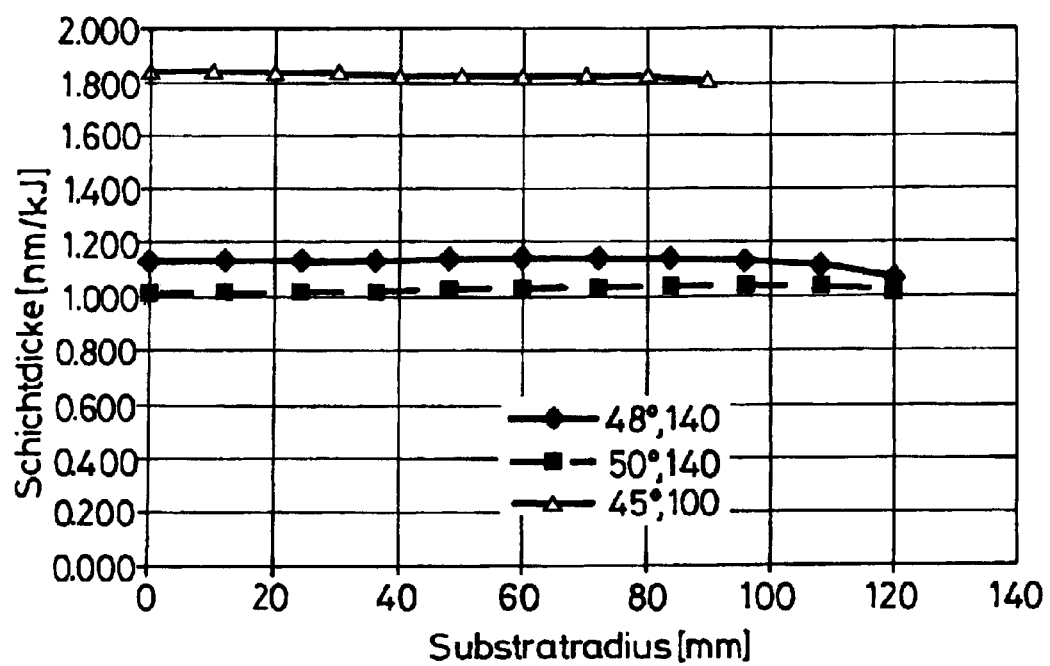
FIG. 10 is a graph of layer thicknesses removed along the substrate radius as the result of described coating experiments.

FIG. 6 schematically shows a first embodiment of a vacuum treatment system according to the invention having at least one sputtering chamber 20 according to the invention. The sputtering chamber 20, together with the magnetron source 21, which, for maintenance purposes or for a target change, can be folded open as illustrated by a broken line, is flanged to a transport chamber 23. A transport device 27, which is rotationally movable about an axis of rotation B by a drive 25, operates in the transport chamber 23. One, two or more (see FIG. 10) transport arms 29 with at least one component radial with respect to the axis B project to the outside from the axis of rotation B and each carry substrate carriers 31. As indicated by the double arrow F, the substrate carriers 31 can be moved out in a driven manner; in particular, can be moved into the machining position and be moved back therefrom, and further, as explained above, can be rotated in a driven manner about the axis A of the substrate carriers 31.

Figure 7:
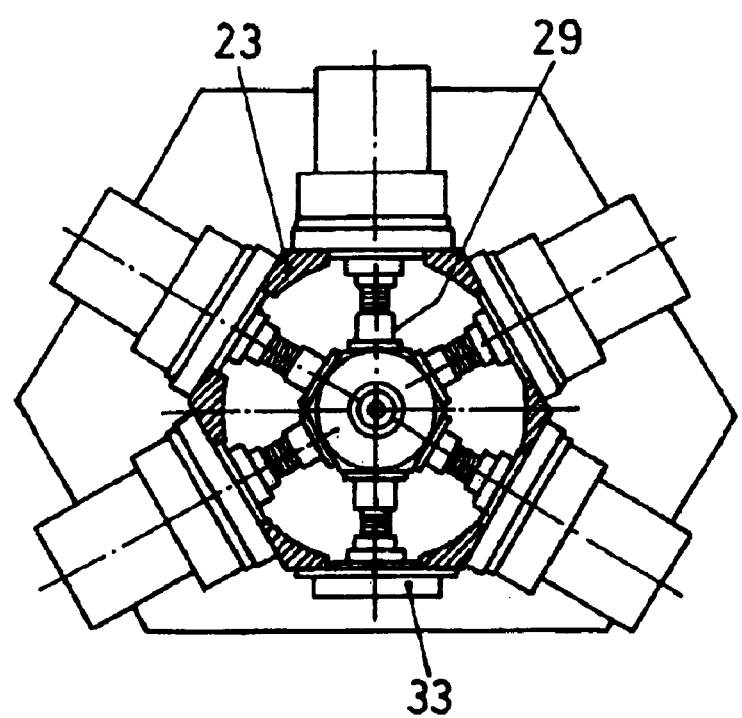
FIG. 7 is a top view of a vacuum treatment system according to the invention basically constructed similar to the system of FIG. 6, but having several treatment stations and an inlet/outlet lock.

Analogous to the top view of FIG. 6, FIG. 7 is a top view of a system with several treatment stations, at least one of which being a sputtering chamber according to the invention.

Directly at the transport chamber 29 or via additional transport chambers, at least one lock chamber 33 is provided, whereby the substrates to be treated are transferred inward from the surroundings into the vacuum or are transferred outward from the vacuum into the surroundings. After being transferred inward, the substrates are fed by one or several transport devices, optionally after passing through additional treatment steps, to a sputter coating station according to the invention, such as station 21 of FIG. 6.

Figure 8:
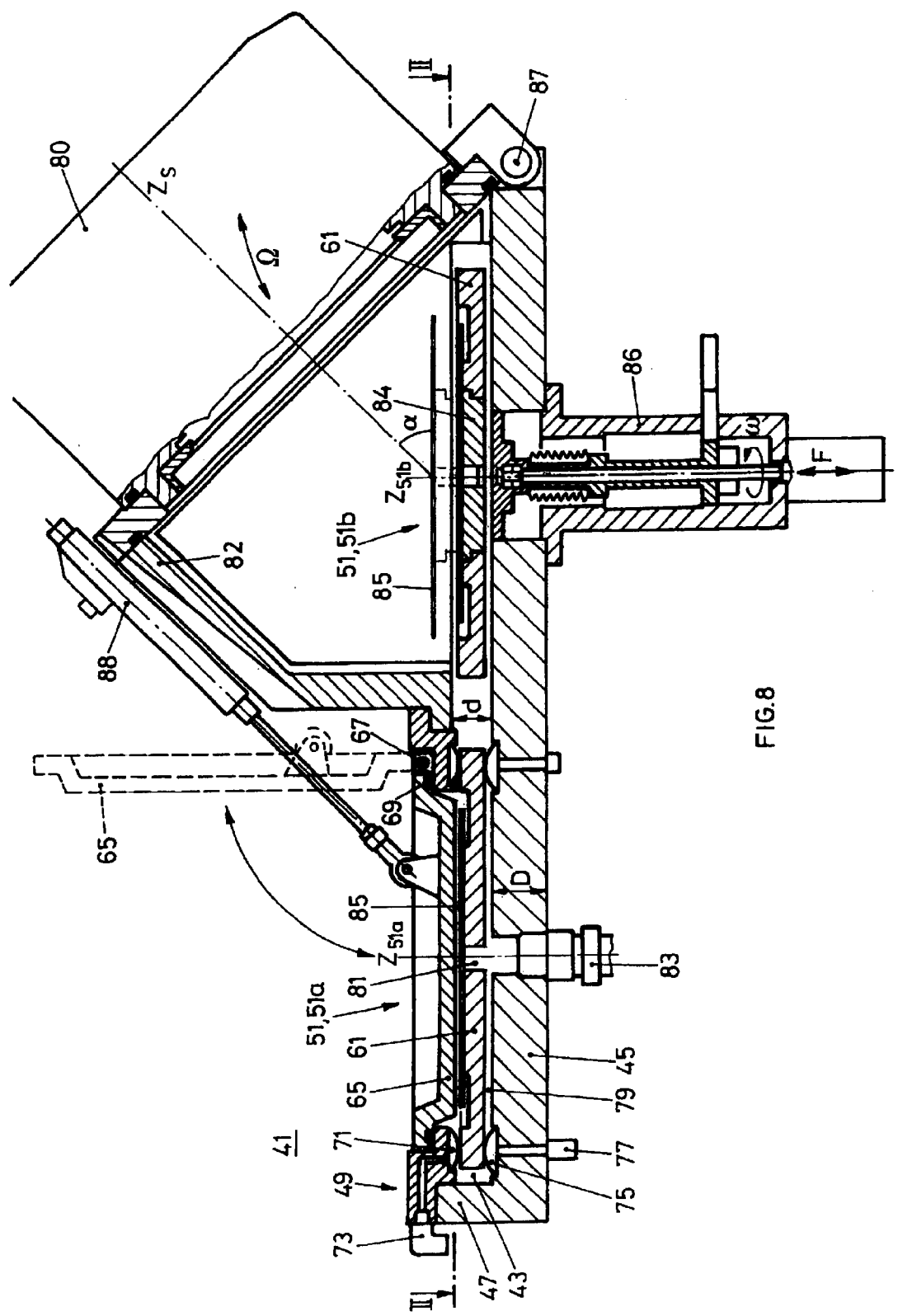
FIG. 8 is a partially simplified view of a transport chamber according to the invention, combined with a sputtering chamber according to the invention for forming a vacuum treatment system of a preferred construction according to the invention.

FIG. 8, on the one hand, illustrates a transport chamber according to the invention, combined with a magnetron sputtering chamber of the above-mentioned type according to the invention, which together, on the other hand, form a system according to the invention.

Figure 9:
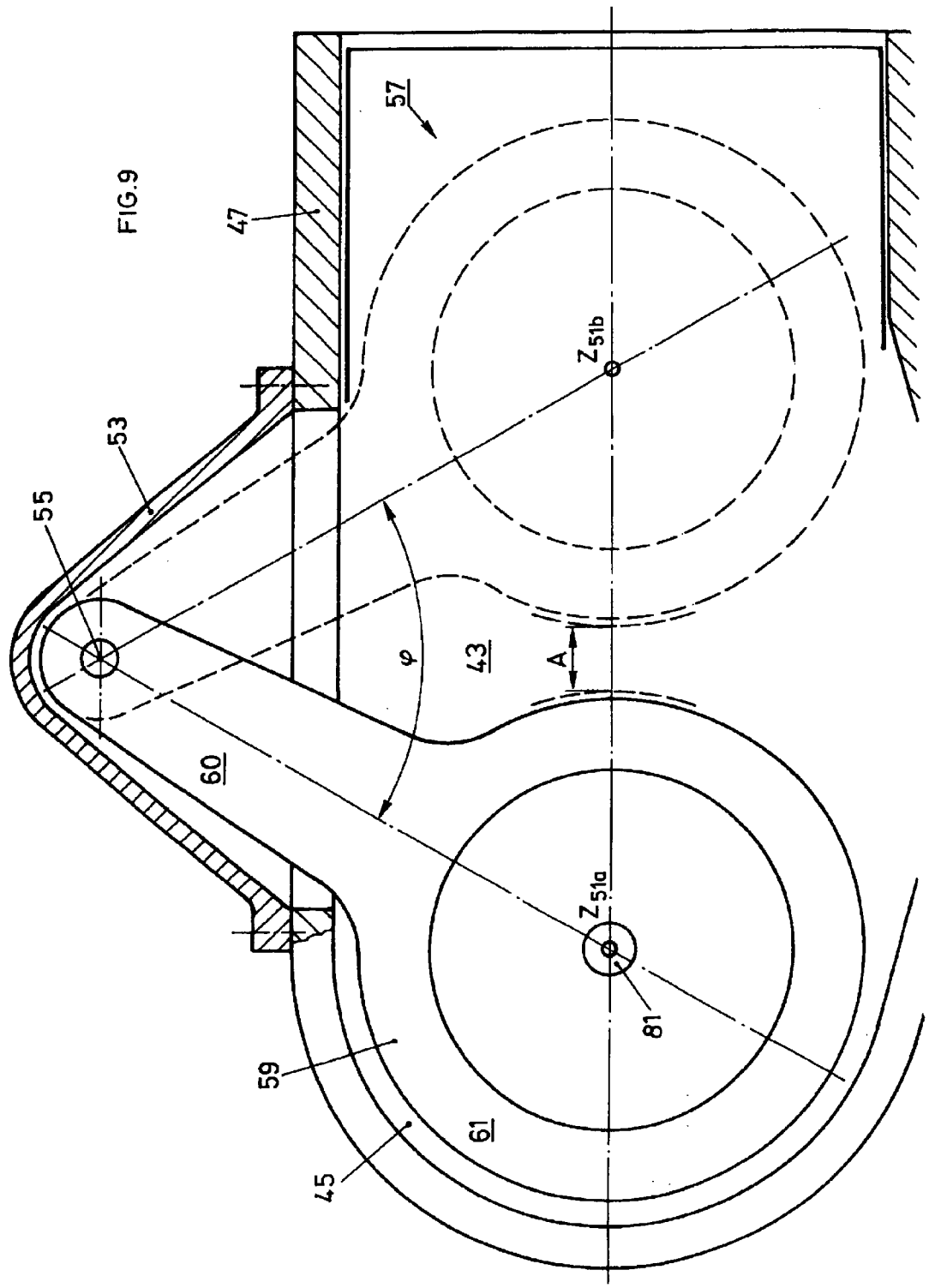
FIG. 9 is a top view of the transport chamber along line II—II of FIG. 8.

FIG. 9 is a sectional view according to Line II—II of the arrangement according to FIG. 8. The combination of the transport chamber and the lock chamber to be described in the following with the above-described magnetron sputtering chamber according to the invention results in an extremely compact system configuration with short transfer and transport cycles and, because of the sputtering chambers according to the invention, in coating cycles which are just as short.

The vacuum transport chamber 41 according to the invention has an interior 43 which, on the one hand, is bounded by a base plate 45 and, on the other hand, is bounded by a side wall structure 47 as well as a covering structure 49 situated opposite the base plate 45. The interior surface of the covering structure 49 can preferably be spaced away from the interior surface of the base plate 45 by a distance d which preferably is no more than identical to the thickness D of the base plate 45, preferably and as illustrated, even significantly smaller.

In the covering structure 49 of the transport chamber according to the invention, workpiece pass-through openings 51 are provided; in the case of the embodiment illustrated in FIGS. 8 and 9, two of such openings 51 being provided. Naturally, more than two of the above-mentioned openings 51 may be provided.

A transport device 57, whose currently preferable construction is illustrated particularly in FIG. 9, operates in the transport chamber according to the invention. Flanged laterally to the base plate 45 or to the side wall structure 47, a rotational axis hosing 51 is provided, wherein the driving axis of rotation 55 of the transport device 57 is disposed. The axis of rotation 55 aligned perpendicularly to the interior surface of the base plate 45, in the illustrated preferred embodiment of the transport chamber according to the invention, carries a transport ladle 59 as the transport device 57. The transport ladle 59 has a stem 60 and a plate-type workpiece receiving device 61. As illustrated in FIG. 9, the transport ladle 59 is swivelled from a first swivelling position, in which the workpiece receiving device 61 is aligned with one of the two openings 51, into the second position illustrated by a broken line, in which the workpiece receiving device 61 is aligned with the second of the above-mentioned openings 51. As illustrated, the axis of rotation 55 of the transport device 57 is arranged offset with respect to a connection line of the central opening axis $Z_{51}$ entered in FIG. 9. Furthermore, the openings 51 at the transport chamber according to the invention are situated so close to one another that, as illustrated particularly in FIG. 8, just enough space exists in-between, for—as will be explained in the following—arranging or flanging one machining station to one of the two openings.

As a result of the above-mentioned position of the axis of rotation 55 as well as the minimizing of the spacing A of the openings (FIG. 9), optimally short transport paths are implemented for the transport device 57, with swivelling angles 1 of no more than 120°, preferably no more than 90°.

In the preferred illustrated embodiment, a lock chamber is integrated at one opening 51. One opening 51a is provided with a cover 65 which, as illustrated in FIG. 8, can be swivelled in a motor-driven manner about a swivelling axis 67. This axis is preferably situated between the openings 51. The cover 65 seals off by way of sealing devices 69 against outer edge parts of the opening 51a on the covering structure 49. The sealing devices 69, in the closed state can optionally be braced by the linear motor cover drive which will be described below.

FIG. 8 illustrates the workpiece receiving device 61 in alignment with the opening 51a as well as in an alignment with the additional opening 51, 51b. In the area of the opening 51a, a sealing arrangement is provided at the inner opening edge surface of the covering structure 49, preferably in the form of a hydraulically, specifically pneumatically operable expandable seal 71, which is acted upon by pressure medium by way of a connection piece 73. By the admission of pressure to the expandable seal 71, this seal 71 is sealingly pressed against the edge area of the workpiece receiving device 61. In order to absorb this peripheral stressing of the seal without any distortion, the workpiece receiving device 61 abuts on the base plate side, particularly in its peripheral area. In the illustrated preferred embodiment, this abutting takes place by way another surrounding, hydraulically, but preferably pneumatically operable and expandable seal 75, which is acted upon by pressure medium by way of one or several connections 77. As illustrated, the surrounding seals 71 and 75 may be situated opposite one another, in each case on inner base plate and covering structure surfaces, or may optionally be offset. In any case, they accommodate between one another, with the admission of pressure, the workpiece receiving device 61 in a sealingly bracing manner.

The seal 75 closes off a remaining chamber volume 79 between the underside of the workpiece receiving device 61 and the interior surface of the base plate 45. This volume as well as the actual lock chamber between the closed cover 65 and the peripherally sealed top side of the workpiece receiving device 61 is pumped down through a center opening 81 (see also FIG. 9) on the workpiece receiving device 61 and a pump connection piece 83, preferably centered with respect to the opening axis $Z_{51}$, on the base plate 45. For a further reduction of the lock chamber volume, the cover 65, as illustrated in FIG. 8, is indented toward the workpiece receiving device 61 to such an extent that its inner surface just barely does not touch a workpiece 85 held in the receiving device 61.

If the workpiece 85, as, for example, the storage disks, particularly the optical storage disks, is provided with a center opening, the reaching-through from the pump connection piece 83 to the lock chamber volume above the workpiece takes place unhindered through this center opening of the workpiece. If the disk-shaped workpiece is constructed without a center opening, (not shown) radial connection channels in the workpiece-facing surface of the workpiece receiving device 61 can improve this reaching-through, as, for example, a network of radial grooves.

The preferred, extremely compact vacuum treatment system illustrated in FIGS. 8 and 9 uses the transport chamber according to the invention with only just two openings 51, specifically openings 51a and 51b. While, as explained above, a smallest-volume lock chamber is integrated at the opening 51a, a workpiece treatment station is flanged to the second opening 51b. In the implemented form of the illustrated system, particularly for the sputter coating of circular-disk-shaped workpieces, particularly of storage disks, in this case, particularly of optical storage disks, the sputtering station 80 according to the invention is mounted on the opening 51b.

In this case, the central axis $Z_S$ of the sputtering source 80 is sloped away from the other opening 51a such that the linear drive 83 for the swivelling movement of the cover 65 can be mounted on the mounting flange 82 for the inclined mounted sputtering source 80.

In the illustrated sputtering system, a central part 84 can be lifted off the workpiece receiving device 61. On the base plate 45, a lifting and rotating drive 86 is mounted which is aligned with the axis $Z_{51b}$. If the workpiece receiving device 61 is centered in the opening 51b, by way of the drive 86, as illustrated by letter F in FIG. 8, via the central part 84, the workpiece 85 in the machining position is lifted with respect to the sputtering source 80 and simultaneously, as illustrated by reference letter 4, is caused to rotate.

In a preferred embodiment, the sputtering source 80 is mounted to be disposed swivellably about an axis 87, which axis 87, with respect to the opening 51b, is situated opposite the axis 67 of the cover 65 and is parallel thereto. As a result, the sputtering source 80 can be folded away without impairing the cover drive 83 on the flange 82, as, for example, for servicing purposes or for replacing the target, as illustrated in FIG. 8 by reference letter Ω.

The transport chamber according to the invention and the vacuum treatment system according to the invention achieve a highly compact, transport path-optimized, constructively simple system and chamber which permits a high throughput while highly uniform coating layer thicknesses are implemented. It is particularly suitable for the transport and the treatment of circular-disk-shaped workpieces, particularly for storage disks, and specifically for the treatment of optical storage disks.

With a system according to the invention of FIGS. 8 and 9, substrates were coated, centered with respect to the substrate carrier axes, which substrates had diameters of 200 mm and 240 mm. The following applied in this case:

[0069]
| | |
|---|---|
| Magnetron source: | ARQ920G-source with an NiV7 round target sold by the applicant |
| target diameter: | 155 mm |
| sputtering power: | 500 W or 1 kW |
| deposited layer thicknesses: | 50 to 100 nm |
| target/substrate spacing (D): | 100 mm and 140 mm | angle of slope β between the central axis of the source and the substrate carrier axis:
45°, 48° and 50°
argon pressure: $2 \times 10^{-3}$ mbar
Use for Master Disks In FIG. 10, the coating results of the above-described example are compiled. They demonstrate the extremely good uniformity of the deposited layer thickness as well as its optimization by a slight change of the above-mentioned angle of slope β.

The foregoing disclosure has been set forth merely to illustrate the invention and is not intended to be limiting.

Since modifications of the disclosed embodiments incorporating the spirit and substance of the invention may occur to persons skilled in the art, the invention should be construed to include everything within the scope of the appended claims and equivalents thereof.

What is claimed is:

1. A method for manufacturing a coated circular substrate, comprising (a) providing a circular area with a radius in a sputtering chamber (b) introducing into said sputtering chamber one substrate of said radius or more than one substrate defining in combination an area of said radius;

(c) rotating said at least one substrate about a first central axis of said circular area;

(d) providing a single magnetron sputtering source with a circular sputtering surface and having a second central axis oblique with respect to and intersecting said first central axis;

(e) selecting the diameter of said circular area to be larger than the diameter of said circular sputtering surface;

(f) selecting an intersection angle of said first and second central axis to be:

$$43° \leq \beta \leq 50°; \text{ and}$$

(g) magnetron sputter coating said at least one substrate by said single magnetron sputtering source.

2. The method of claim 1, further comprising selecting said intersection angle $\beta$ to be approximately 45°.

3. The method of claim 1, further comprising generating with said single magnetron sputtering source at least one circular erosion ditch in said sputtering surface, said erosion ditch having a circular locus $r_{Tr}$, wherein said second central axis intersects said at least one substrate at a distance D from said sputter surface, and selecting $r_{Tr}$ to be $$\frac{1}{4} \leq r_{Tr}/D \leq \frac{2}{3}.$$

4. The method of claim 1, wherein said circular sputtering surface has a diameter $\Phi_T$ and said second central axis intersects said at least one substrate at a distance D from said sputtering surface, further comprising selecting $\Phi_T$ to be:

$$\frac{3}{4} \leq \Phi_T/D \leq 2.$$

5. The method of claim 4, further comprising selecting $\Phi_T$ to be $\approx 1.2$ D.

6. The method of claim 1, wherein said circular area has a diameter $\Phi_S$, and said second central axis intersects said at least one substrate at a distance D from said sputtering surface, further comprising selecting $\Phi_S$ to be:

$$\Phi_S/4\ D \leq 1.8.$$

7. The method of claim 1, wherein said circular area has a diameter $\Phi_S$, and said circular sputtering surface has a diameter $\Phi_T$, further comprising selecting $\Phi_T$ to be:

$$1 < \Phi_S/\Phi_T \leq 2.4.$$

8. The method of claim 1, wherein said circular area has a diameter of $\Phi_S$ selected to be:

$$50\ \text{mm} \leq \Phi_S \leq 400\ \text{mm}.$$

9. The method of claim 8, wherein $\Phi_S$ is selected to be:

$$50\ \text{mm} \leq \Phi_S \leq 300\ \text{mm}.$$

10. The method of of claim 1, wherein said at least one substrate is one of a data storage disc and of a wafer.

11. The method of claim 1, wherein said at least one substrate has a diameter of one of 64 mm, 120 mm, 160 mm, 240 mm.

* * * * *